(12) United States Patent
Uzoh et al.

(10) Patent No.: US 10,475,733 B2
(45) Date of Patent: Nov. 12, 2019

(54) METHOD AND STRUCTURES FOR HEAT DISSIPATING INTERPOSERS

(71) Applicant: Invensas Corporation, San Jose, CA (US)

(72) Inventors: Cyprian Emeka Uzoh, San Jose, CA (US); Pezhman Monadgemi, Fremont, CA (US); Terrence Caskey, Santa Cruz, CA (US); Fatima Lina Ayatollahi, Fremont, CA (US); Belgacem Haba, Saratoga, CA (US); Charles G. Woychik, San Jose, CA (US); Michael Newman, Fort Collins, CO (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/156,595

(22) Filed: Oct. 10, 2018

(65) Prior Publication Data
US 2019/0139878 A1    May 9, 2019

Related U.S. Application Data

(60) Continuation of application No. 15/626,687, filed on Jun. 19, 2017, now Pat. No. 10,103,094, which is a
(Continued)

(51) Int. Cl.
*H05K 1/09* (2006.01)
*H05K 1/11* (2006.01)
(Continued)

(52) U.S. Cl.
CPC .. *H01L 23/49827* (2013.01); *H01L 21/76829* (2013.01); *H01L 23/36* (2013.01);
(Continued)

(58) Field of Classification Search
USPC ........ 174/252, 257, 262, 264, 265; 257/762, 257/764; 438/98, 202, 421
See application file for complete search history.

(56) References Cited

U.S. PATENT DOCUMENTS 3,975,471 A    8/1976  Hrovat et al.
5,494,833 A    2/1996  Martin et al.
(Continued)

OTHER PUBLICATIONS

International Search Report & Written Opinion for Application No. PCT/US2013/076158 dated Apr. 28, 2014.
(Continued)

*Primary Examiner* — Xiaoliang Chen
(74) *Attorney, Agent, or Firm* — Lerner, David, Littenberg, Krumholz & Mentlik, LLP

(57) ABSTRACT

An interconnect element includes a semiconductor or insulating material layer that has a first thickness and defines a first surface; a thermally conductive layer; a plurality of conductive elements; and a dielectric coating. The thermally conductive layer includes a second thickness of at least 10 microns and defines a second surface of the interconnect element. The plurality of conductive elements extend from the first surface of the interconnect element to the second surface of the interconnect element. The dielectric coating is between at least a portion of each conductive element and the thermally conductive layer.

9 Claims, 12 Drawing Sheets

Related U.S. Application Data division of application No. 14/815,282, filed on Jul. 31, 2015, now Pat. No. 9,685,401, which is a division of application No. 13/720,346, filed on Dec. 19, 2012, now Pat. No. 9,123,780.

(51) Int. Cl.

| | | |
|---|---|---|
| *H05K 3/38* | (2006.01) | |
| *H01L 21/02* | (2006.01) | |
| *H01L 21/48* | (2006.01) | |
| *H01L 23/52* | (2006.01) | |
| *H01L 23/522* | (2006.01) | |
| *H01L 23/532* | (2006.01) | |
| *H01L 23/498* | (2006.01) | |
| *H01L 21/768* | (2006.01) | |
| *H01L 23/373* | (2006.01) | |
| *H01L 23/367* | (2006.01) | |
| *H01L 23/48* | (2006.01) | |
| *H01L 23/36* | (2006.01) | |

(52) U.S. Cl.
CPC ........ *H01L 23/367* (2013.01); *H01L 23/3736* (2013.01); *H01L 23/481* (2013.01); *H01L 23/49838* (2013.01); *H01L 23/49866* (2013.01); *H01L 21/76898* (2013.01); *H01L 23/3677* (2013.01); *H01L 2924/00* (2013.01); *H01L 2924/0002* (2013.01)

(56) References Cited

U.S. PATENT DOCUMENTS

| | | | |
|---|---|---|---|
| 5,532,173 A | 7/1996 | Martin et al. | |
| 5,590,538 A | 1/1997 | Hsu et al. | |
| 5,608,264 A | 3/1997 | Gaul | |
| 5,618,752 A | 4/1997 | Gaul | |
| 5,646,067 A | 7/1997 | Gaul | |
| 5,646,479 A | 7/1997 | Troxell | |
| 5,682,062 A | 10/1997 | Gaul | |
| 5,814,889 A | 9/1998 | Gaul | |
| 5,949,030 A * | 9/1999 | Fasano ................. H01L 21/486 174/262 |
| 5,970,287 A * | 10/1999 | Yamaguchi ........ G03G 15/0291 250/325 |
| 6,104,092 A * | 8/2000 | Matsubara ........ H01L 21/32051 257/764 |
| 6,705,394 B1 | 3/2004 | Moslehi et al. | |
| 6,787,896 B1 | 9/2004 | Petty-Weeks | |
| 6,812,113 B1 * | 11/2004 | Alieu ................. H01L 21/7682 257/E21.581 |
| 7,241,641 B2 | 7/2007 | Savastiouk et al. | |
| 7,948,092 B2 | 5/2011 | Murayama et al. | |
| 8,105,875 B1 | 1/2012 | Hu et al. | |
| 8,159,066 B2 | 4/2012 | Yang | |
| 8,314,483 B2 | 11/2012 | Lin et al. | |
| 8,414,961 B1 * | 4/2013 | Robinson ........ H01L 31/022466 427/74 |
| 2002/0020862 A1 | 2/2002 | Livengood et al. | |
| 2002/0020917 A1 | 2/2002 | Hirota et al. | |
| 2002/0030267 A1 | 3/2002 | Suzuki | |
| 2002/0134685 A1 | 9/2002 | Chakravorty et al. | |
| 2003/0116427 A1 | 6/2003 | Ding et al. | |
| 2003/0136577 A1 | 7/2003 | Abe | |
| 2003/0151032 A1 * | 8/2003 | Ito ............................ C08K 9/02 252/570 |
| 2003/0183159 A1 | 10/2003 | Nakagawa et al. | |
| 2003/0183823 A1 | 10/2003 | Searls et al. | |
| 2005/0006222 A1 | 1/2005 | Ding et al. | |
| 2005/0046002 A1 | 3/2005 | Lee et al. | |
| 2005/0153546 A1 | 7/2005 | Ahrens et al. | |
| 2005/0158619 A1 | 7/2005 | Honda et al. | |
| 2005/0186704 A1 | 8/2005 | Yee et al. | |
| 2005/0189655 A1 * | 9/2005 | Furukawa ............... B82Y 10/00 257/762 |
| 2006/0068611 A1 | 3/2006 | Weaver et al. | |
| 2006/0097378 A1 | 5/2006 | Yamano | |
| 2006/0128088 A1 * | 6/2006 | Graham ................. B82Y 10/00 438/202 |
| 2006/0130489 A1 | 6/2006 | Weaver | |
| 2006/0283629 A1 | 12/2006 | Kikuchi et al. | |
| 2007/0023888 A1 | 2/2007 | Fujii | |
| 2007/0069357 A1 | 3/2007 | Weaver et al. | |
| 2007/0079986 A1 | 4/2007 | Kikuchi et al. | |
| 2007/0257766 A1 | 11/2007 | Richards et al. | |
| 2008/0017946 A1 | 1/2008 | Cazaux et al. | |
| 2008/0164573 A1 | 7/2008 | Basker et al. | |
| 2008/0218985 A1 | 9/2008 | Takeda | |
| 2009/0032966 A1 | 2/2009 | Lee et al. | |
| 2009/0045487 A1 | 2/2009 | Jung | |
| 2009/0134497 A1 | 5/2009 | Barth et al. | |
| 2009/0224372 A1 | 9/2009 | Johnson | |
| 2009/0224410 A1 | 9/2009 | Johnson | |
| 2009/0266599 A1 | 10/2009 | Kan et al. | |
| 2010/0003781 A1 * | 1/2010 | Van Duren ......... H01L 31/1884 438/98 |
| 2010/0020473 A1 * | 1/2010 | Prymak .................. H01G 9/012 361/523 |
| 2010/0090219 A1 | 4/2010 | Jung | |
| 2010/0187670 A1 | 7/2010 | Lin et al. | |
| 2010/0314758 A1 | 12/2010 | Wu et al. | |
| 2011/0031613 A1 | 2/2011 | Yang | |
| 2011/0088928 A1 | 4/2011 | Lim et al. | |
| 2011/0193221 A1 | 8/2011 | Hu et al. | |
| 2011/0242817 A1 | 10/2011 | Chowdhury et al. | |
| 2011/0254160 A1 | 10/2011 | Tsai et al. | |
| 2011/0304038 A1 | 12/2011 | Lee | |
| 2011/0304999 A1 | 12/2011 | Yu et al. | |
| 2012/0032326 A1 | 2/2012 | Kim et al. | |
| 2012/0235305 A1 | 9/2012 | Kim et al. | |
| 2012/0261801 A1 | 10/2012 | Takano et al. | |
| 2012/0261832 A1 | 10/2012 | Takano et al. | |
| 2012/0306080 A1 | 12/2012 | Yu et al. | |
| 2013/0026645 A1 | 1/2013 | Mohammed et al. | |
| 2013/0037943 A1 | 2/2013 | Yamano | |
| 2013/0049195 A1 | 2/2013 | Wu et al. | |
| 2013/0082908 A1 | 4/2013 | Lynch et al. | |
| 2013/0088461 A1 | 4/2013 | Ohshima et al. | |
| 2013/0093098 A1 | 4/2013 | Yang et al. | |
| 2013/0099360 A1 | 4/2013 | Son | |
| 2013/0161813 A1 | 6/2013 | Miki | |
| 2013/0217188 A1 | 8/2013 | Wang et al. | |
| 2013/0241078 A1 | 9/2013 | Lee et al. | |
| 2013/0244020 A1 | 9/2013 | Terada et al. | |
| 2013/0273694 A1 | 10/2013 | Hsieh et al. | |
| 2013/0277097 A1 * | 10/2013 | Maeng, II ................ H05K 1/09 174/257 |

OTHER PUBLICATIONS

P. Magill, "A New Thermal-Management Paradigm for Power Devices", Power Electronics Technology Nov. 2008.

* cited by examiner

METHOD AND STRUCTURES FOR HEAT DISSIPATING INTERPOSERS

CROSS-REFERENCES TO RELATED APPLICATIONS

The present application is a continuation of a of U.S. patent application Ser. No. 15/626,687, filed on Jun. 19, 2017, which is issuing on Oct. 16, 2018 as U.S. Pat. No. 10,103,094, which is a divisional of U.S. patent application Ser. No. 14/815,282, filed on Jul. 31, 2015, which issued on Jun. 20, 2017 as U.S. Pat. No. 9,685,401, which is a divisional of U.S. patent application Ser. No. 13/720,346, filed on Dec. 19, 2012, which issued on Sep. 1, 2015 as U.S. Pat. No. 9,123,780, the disclosures all of which are incorporated herein by reference.

BACKGROUND OF THE INVENTION

The technological area of three-dimensional integrated chips ("3D-IC") and related structures is constantly seeking faster, smaller, and more powerful structures for use in computers and computer devices. This can result in chip structures that are increasingly more densely packed and have ever greater levels of power consumption. Further, chip structures can include many chips in single packages and/or stacks arrangements of multiple packages. In one example, central processing units or general processing units can include a control chip included in a package with an additional package or packages stacked thereon that include memory chips, such as DRAM or the like. Such structures can be used as processors for smartphones or the like where a small footprint or overall size for the assembly is sought.

In these and other assemblies including stacked arrangements of integrated circuit chips and the like, and in particular those with high circuit density or high power consumption, heat dissipation can negatively impact chip performance. For example, in vertically stacked arrangements, heat tends to dissipate vertically through the structure, meaning that heat from, for example, a control or logic chip can end up dissipating into memory chips stacked thereon as the heat is conducted through the stack. This phenomenon can cause overall heating of chips in a stack to undesirable levels, either throughout the entire chip or in various "hot spots" in which a spatial temperature gradient is created in a chip by heat dissipation from lower chips. In either form, such heat can cause decreased chip performance or partial or complete chip failure. Accordingly, heat dissipation is important for such structures.

Heat dissipation has been dealt with in stacked chip arrangements, for example, by attempts to make vertical heat dissipation as fast as possible, such as by including large heat spreader structures that can include a plurality of fins or the like, on top of a stacked chip arrangement. However, this undesirably increases the size of the assembly. Additionally, active cooling systems have been introduced to dissipate heat more quickly and in some instances in lateral directions, rather than vertical. However, for many applications, such as mobile devices or the like, the increase in overall power consumption required by active cooling is undesirable. Accordingly, further advances are needed.

BRIEF SUMMARY OF THE INVENTION

An aspect of the present disclosure relates to a method for making an interconnect element. The method includes depositing a thermally conductive layer on an in-process unit. The in-process unit includes a semiconductor material layer defining a surface and edges surrounding the surface, a plurality of conductive elements, each conductive element having a first portion extending through the semiconductor material layer and a second portion extending from the surface of the semiconductor material layer. Dielectric coatings extend over at least the second portion of each conductive element. The thermally conductive layer is deposited on the in-process unit at a thickness of at least 10 microns so as to overlie a portion of the surface of the semiconductor material layer between the second portions of the conductive elements with the dielectric coatings positioned between the conductive elements and the thermally conductive layer. The thermally conductive layer can be further deposited to overlie the surface of the semiconductor material in a location adjacent to at least one edge of the semiconductor material layer.

The method can further include, prior to depositing the thermally conductive layer, removing a portion of the semiconductor material layer to expose the edge surfaces of the conductive elements and to define the surface of the semiconductor layer such that portions of the conductive elements extend away therefrom. The method can also further include, prior to the step of depositing the thermally conductive layer, depositing a barrier layer over at least the surface of the semiconductor material layer. In such an example, the thermally conductive layer can be deposited over the barrier layer such that the barrier layer electrically insulates the semiconductor material layer from the thermally conductive layer. The barrier layer can comprise one of diamond, diamond-like carbon, or diamond moieties.

Depositing the thermally conductive layer can include forming a seed layer overlying the semiconductor material layer, and can further include plating the thermally conductive layer over the seed layer. In any of the examples herein, the thermally conductive layer can be deposited by a process including one of screen printing, or spin coating. Further depositing the thermally conductive layer can include depositing copper having a thickness of 10-300 microns. In another example, depositing the thermally conductive layer can include depositing a highly thermally conductive material of one of graphite and carbon at a thickness of 10-200 microns.

The method can further include forming a redistribution layer over the thermally conductive layer. The redistribution layer can include traces connected with at least some of the conductive elements.

In an example of the method, each conductive element further has an edge surface and an end surface, the end surface being spaced apart from the surface of the semiconductor material layer. In such an example the thermally conductive layer can be further deposited to extend over respective edge surfaces of the conductive elements. The thermally conductive layer can be deposited over the edge surface and end surface of the conductive element, and the method can further include removing a portion of the thermally conductive layer that overlies the end surface to expose the end surface at a surface of the thermally conductive layer.

The method can further include depositing a patternable material layer over the surface of the semiconductor material layer and patterning the patternable material layer to form a plurality of spacers extending in at least one lateral direction along the surface of the semiconductor material layer prior to depositing the thermally conductive layer. The thermally conductive layer can then be deposited in a plurality of sections with respective ones of the spacers therebetween. In an example, the patternable material layer can be of a resist material. The patternable material layer can be deposited over the surface of the semiconductor material layer to extend to at least one edge of the semiconductor material layer. Further, the spacers and the sections of the thermally conductive layer can be formed to extend to at least one edge of the semiconductor material layer.

In another example, the method can further include removing portions of the thermally conductive layer to form a plurality of gaps extending in at least one lateral direction over the surface of the semiconductor material layer. The gaps can be between respective sections of the thermally conductive layer. The portions of the thermally conductive layer can be removed by etching. In such an example, the method can further include depositing a compliant material within at portions of at least one of the gaps. The compliant material can be a polymeric material having thermally conductive particles suspended therein. Additionally or alternatively, the sections of the thermally conductive layer can define substantially co-planar outside surfaces, and the compliant material can be deposited so as to be recessed below the outside surfaces. The compliant material can be deposited so as to be spaced apart from the surface of the semiconductor material layer.

The method can further include assembling a conductive frame element with the interconnect element in contact with the thermally conductive layer and further extending over at least one edge of the semiconductor material layer. The conductive frame element can be assembled around a perimeter of the interconnect element.

In an example, the thermally conductive layer can be deposited such that an aggregate of the conductive elements and the thermally conductive layer covers at least 90% of a surface area defined by the edges of the semiconductor layer. In another example, the thermally conductive layer can be deposited such that an aggregate of the conductive elements and the thermally conductive layer occupies at least 90% of an area defined by a theoretical cross-section of the interconnect element outside of the semiconductor layer. Such a cross-section can be determined by a plane normal to the surface of the semiconductor layer.

Another aspect of the present disclosure relates to a method for making an interconnect element. The method includes forming a conductive element within a semiconductor material layer. The conductive element is formed to extend into the semiconductor material layer from a first surface and having at least one end surface and one edge surface extending from the first surface of the semiconductor material layer to the end surface of the conductive element. A portion of material is then removed from a second surface of the semiconductor substrate to reveal the end surface of the conductive element and at least a portion of the edge surface of the conductive element. The method also includes depositing a thermally conductive layer on the in-process unit over the surface of the semiconductor layer at a thickness of at least 10 microns so as to overlie a portion of the surface of the semiconductor material layer between the second portions of the conductive elements with the dielectric coatings positioned between the conductive elements and the thermally conductive layer.

The step of depositing the thermally conductive layer can include depositing copper, and the thermally conductive layer can be deposited having a thickness of 10-300 microns. In another example, depositing the thermally conductive layer can include depositing a highly thermally conductive material of one of graphite and carbon, and the thermally conductive layer can be deposited at a thickness of 10-200 microns.

The method can further include forming a redistribution layer over the thermally conductive layer. Such a redistribution layer can include traces connected with at least some of the conductive elements.

The step of depositing the thermally conductive layer can include patterning the thermally conductive layer to form gaps between sections thereof. The sections of the thermally conductive layer can be fins that extend from and along the surface of the semiconductor material layer. Depositing the thermally conductive layer can further include filing the gaps with a polymer. In another example, the step of depositing the thermally conductive layer can include depositing sections of the thermally conductive layer between portions of a patterned resist layer such that the portions of the patterned resist layer fill gaps between the section of the thermally conductive layer.

Another aspect of the present disclosure relates to an interconnect element including a semiconductor or insulating material layer having a first thickness and defining a first surface. The interconnect element also includes a thermally conductive layer having a second thickness of at least 10 microns and defining a second surface of the interconnect element. A plurality of conductive elements extend from the first surface of the interconnect element to the second surface of the interconnect element. Dielectric coatings are positioned between at least a portion of each conductive element and the thermally conductive layer.

The thermally conductive layer can be electrically connected with at least one of the conductive elements such that the conductive element is configured as a ground element. In another example, the conductive elements are configured as through-substrate electrodes that define conductive connections between surfaces thereof.

The thermally conductive layer can extend from proximate to the conductive elements to at least one edge of the semiconductor or insulating material layer.

The interconnect element can further include a barrier layer between at least the surface of the semiconductor or insulating material layer and the thermally conductive layer. Such a barrier layer can electrically insulate the semiconductor or insulating material layer from the thermally conductive layer. The barrier layer can comprises one of diamond, diamond-like carbon, or diamond moieties.

The thermally conductive layer can include copper, and the thermally conductive layer can have a thickness of between 10 and 300 microns. In another example the thermally conductive layer can include a highly thermally conductive material of one of graphite and carbon, and the thermally conductive layer can have a thickness of between 10 and 200 microns.

The interconnect element can further include a redistribution layer overlying the thermally conductive layer. The redistribution layer can include traces connected with at least some of the conductive elements.

The thermally conductive layer can include a plurality of sections extending in at least one lateral direction along the surface of the semiconductor layer, and the interconnect element can further include a plurality of spacers between adjacent ones of the sections of the thermally conductive layer. The spacers and the sections of the thermally conductive layer can extend to at least one edge of the semiconductor material layer. In another example, the spacers can extend along a path having directional components in at least two lateral directions. In either example, the spacers can be of a compliant, heat conductive material. For example, the spacers can be of a polymeric material having thermally conductive particles suspended therein. The sections of the thermally conductive layer can define substantially co-planar outside surfaces, and the spacers can be recessed below the outside surfaces. In another example, the spacers can be spaced apart from the surface of the semiconductor or insulating material layer.

The interconnect element can further include a heat conductive frame element in contact with the thermally conductive layer and further extending over at least one edge of the semiconductor or insulating material layer. The conductive frame element can be positioned around a perimeter of the interconnect element.

The interconnect element can further include at least one of an active or passive device within the semiconductor layer that is electrically connected with at least one of the conductive elements.

Another aspect of the present disclosure relates to a microelectronic assembly. The assembly includes an interconnect element according any of the above examples, and a microelectronic element including contact elements at a surface thereof. The microelectronic element is attached to the interconnect element and the contact elements are electrically connected with the conductive elements.

In such an assembly, the interconnect element can be attached to the microelectronic package and the contact elements can be electrically connected with the conductive elements by joints between the contact elements and the end surfaces of the conductive elements. The interconnect element can include contact elements at a surface thereof that are electrically connected with the conductive elements, and the interconnect element can be attached with the microelectronic package with the contact elements electrically connected with the conductive elements by joints between the contact elements and the contact pads.

Another aspect of the present disclosure relates to a method of fabricating a microelectronic package including assembling an interconnect element as described in any of the examples above with a microelectronic package having contact elements at a surface thereof such that the interconnect element is attached with the microelectronic package and the contact elements are electronically interconnected with the conductive elements. The step of assembling can include joining the contact elements with end surfaces of the conductive elements. In another example, the step of assembling can include joining the contact elements with ones of the contact pads of the interconnect element that are at a surface of the interconnect element. The conductive pads can be electrically connected with the conductive elements by traces interconnect element.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

DETAILED DESCRIPTION

Figure 1:
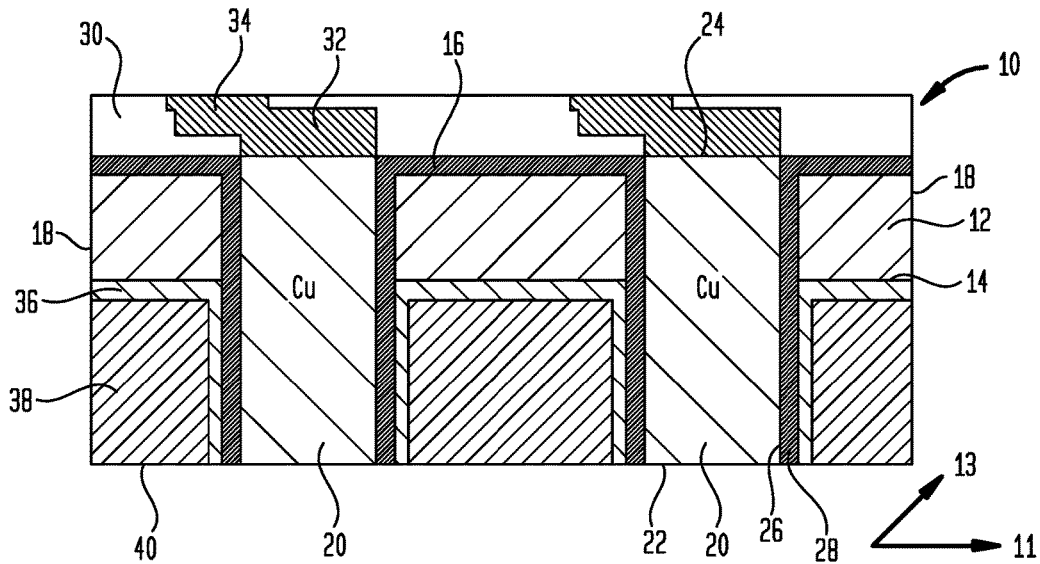
FIG. 1 is a schematic view of an interconnect element according to an aspect of the disclosure.

Turning to the figures, wherein like reference numerals are used to indicate similar features, there is shown in FIG. 1, an interconnection element in accordance with an aspect of the present disclosure. The interconnection element shown in FIG. 1 is in the exemplary form of an interposer 10, but other interconnection elements can be constructed according to the description herein. Interposer 10 includes a plurality of connection elements extending at least partially therethrough. The connection elements shown in FIG. 1 are in the exemplary form of through-substrate vias 20 configured to provide an electrical connection between opposed end surfaces 22 and 24 thereof. Other connection elements can be incorporated or otherwise used in interconnection elements according to aspects of the present disclosure including interposers or other examples thereof.

Interposer 10 includes a semiconductor material layer 12 defining opposing surfaces 14 and 16 that can be generally parallel and extend in lateral directions 11 and 13, where lateral direction 13 indicates a direction into or out of the page in FIG. 1. In other examples or embodiments of interposer 10, an insulating, or dielectric, layer can be used in place of semiconductor material layer 12. Such examples and embodiments can be similar in all other respects to those including a semiconductor material layer 12, as described herein. A thickness of the semiconductor material layer 12 is defined between surfaces 14 and 16. Examples of materials that can comprise the semiconductor material layer include silicon, diamond, germanium, silicon carbide, certain ceramics or the like. The vias 20 extend at least partially through the semiconductor layer 12 such that the respective end surfaces 22 and 24 are at respective surfaces 14 and 16 of the semiconductor material. As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. The vias 20 are further structured to extend outwardly of semiconductor layer with end surface 22 thereof spaced above surface 14 of semiconductor material layer 12. The relative term "above" is used herein with respect to the example orientation of interposer 10 shown in FIG. 1 and is not limiting with respect to actual positions of the elements discussed herein.

Semiconductor material layer 12 is structured such that surface 14 is positioned between end surfaces 22 and 24 of via 20. A thermally conductive material layer 38 overlies surface 14 and extends along portions of the vias 20, including along edge surfaces 26 thereof, that extend above the semiconductor material layer 12. Thermally conductive layer is generally structured to surround such portions of vias 20 and to fill spaces therebetween. Thermally conductive layer 38 may be further structured to extend along surface 14 in lateral directions 11,13 toward the edges 18 thereof. In one example, semiconductor material layer 12 can include four edges and thermally conductive layer can be configured to extend to a position adjacent at least one of the edges 18 of semiconductor material layer 12. In another example, thermally conductive layer can extend to positions adjacent or overlying edges 18 on opposing sides of semiconductor material layer 12. In yet another example, thermally conductive layer can extend to positions adjacent all edges 18 of semiconductor material layer 12. In such examples, adjacent an edge 18 can mean that thermally conductive layer is flush with such an edge 18 along a portion thereof or spaced inwardly in lateral directions 11,13 from edge 18 along surface 14 such that, for example, thermally conductive layer is positioned between the edge 18 and a closest one of vias 20 to that edge 18. In another example, adjacent an edge 18 can mean that thermally conductive layer is positioned within 100 microns of edge 18.

Thermally conductive layer 38 can define a surface 40 that is spaced apart from and faces away from surface 14 of semiconductor material layer 12. Surface 40 can be adjacent end surfaces 22 of vias 20 such that surface 40 can be flush with end surfaces 22 or such that end surfaces 22 can project above or be recessed below surface 40. Such a relationship between end surface 22 and surface 40 can be dictated or otherwise influenced by different types of conductive elements that can be joined with end surfaces 22 such as traces, contact pads, vias or the like.

Thermally conductive layer 38 can comprise or consist essentially of a thermally conductive material, such as metals including copper, aluminum, nickel, gold, or various alloys of these and other metals. In other examples, thermally conductive layer 38 can comprise or consist essentially of a material including carbon, such as graphite or the like. One example of such a material is highly ordered pyrolytic graphite ("HOPG"). By including thermally conductive layer around and between vias 20 and extending in lateral directions toward the edges of semiconductor material layer 12, thermally conductive layer can conduct heat in lateral directions throughout the interposer 10 structure. This can prevent or reduce the appearance of "hot spots" within the interposer 10 itself or in an assembly (such as assembly 60 in FIG. 9 or assembly 62 in FIG. 10) that includes interposer 10 or interposers 10 that can arise from the vertical dissipation of heat that occurs within such interposers related assemblies.

The lateral heat dissipation provided by thermally conductive layer may not eliminate vertical heat dissipation through interposer 10 or assemblies 60 or 62, but by adding a lateral component to such heat dissipation, the amount of heat passing vertically through any one area can be decreased as at least some of the heat travels laterally to an extent while also traveling vertically. Thus, the area through which vertical heat dissipation occurs can be increased, while the maximum amount of heat dissipated through various points within such an area is reduced, accordingly reducing maximum temperatures to which structures within such a dissipation area are raised by such a heat flow.

Figure 25:
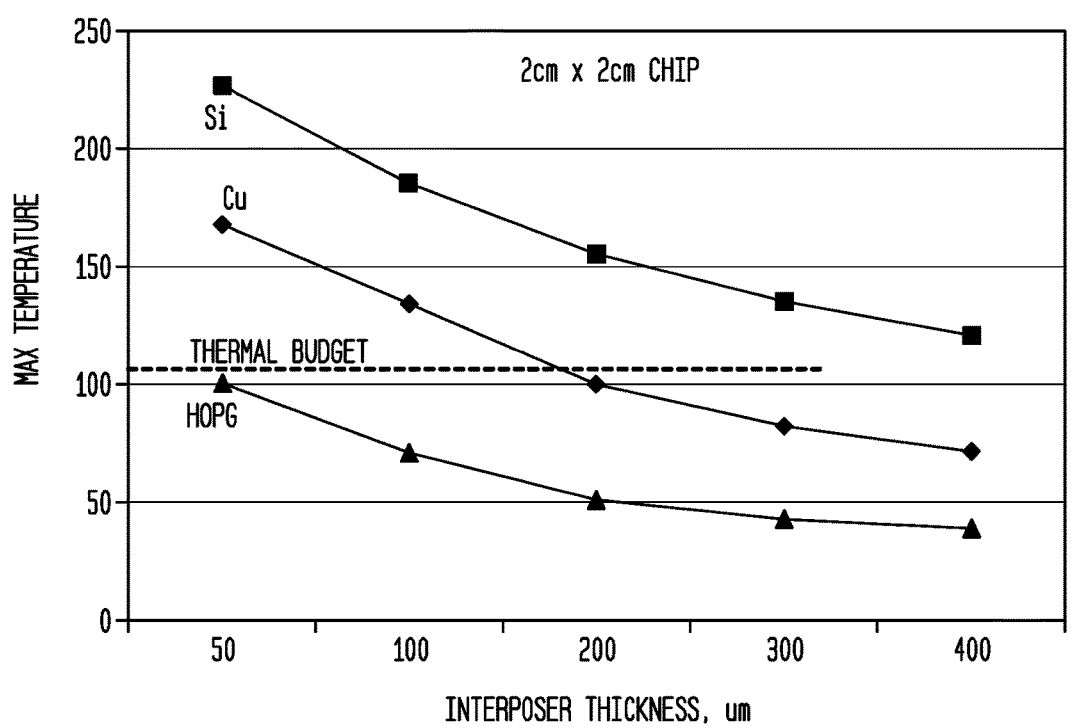
FIG. 25 is a chart showing a maximum temperature reached in example interposers of varying compositions and thicknesses.

As shown in FIG. 25, the thickness and composition of thermally conductive layer 38 can relate to the amount of lateral heat dissipation achieved by thermally conductive layer 38. Of the various materials that can be used for thermally conductive layer 38, some may be more thermally conductive than others, particularly among metals. Accordingly, less thermally conductive materials may require that a thermally conductive layer 38 of such materials have a greater thickness that those of other materials. In particular, many microelectronic elements, such as semiconductor chips and the like, have an accepted temperature threshold, above which the performance of such elements decreases or above which actual damage to the components can occur. Accordingly, in some examples, it may be beneficial to provide thermally conductive layers in interposers 10 to provide adequate lateral heat dissipation to maintain maximum point temperatures within assemblies that include such interposers 10 below such thresholds. In the particular examples shown in FIG. 25, 2 cm by 2 cm chips including interposers with thermally conductive layers of various materials were shown to adequately maintain temperatures within the chips below an exemplary thermal budget of 105° C. at 200 μm or thicker for a thermally conductive layer of copper and 50 μm or thicker for HOPG. As shown, HOPG can be effective at laterally dissipating heat, particularly when ordered laterally, which allows the HOPG layer to be more thermally conductive in the lateral directions than it is in vertical directions.

Other thicknesses for thermally conductive layers of copper and HOPG can be used in larger or smaller chips or in chips with varying forms of microelectronic elements and/or active and passive devices or in chips of varying sizes. In various examples, an interposer 10 used in various applications within a range of acceptable sizes can have a thermally conductive layer with a thickness of between 10 and 200 microns. Other applications can have a thermally conductive layer of 200 microns or greater. As further shown in FIG. 25, a semiconductor material such as silicon is less thermally conductive than the materials described herein for use as a thermally conductive layer. Accordingly, such a semiconductor material may have to be far thicker than would be practical to even reach an upper threshold of a thermal budget.

In applications where thermally conductive layer 38 is of a material that is also electrically conductive, such as in variations of thermally conductive layer 38 that include metal, a dielectric coating can be positioned between vias 20 and thermally conductive layer 38. As shown in FIG. 1, dielectric coatings 28 can extend along edge surfaces 26 of vias 20 so as to surround vias 20 and electrically insulate them from thermally conductive layer 38. Dielectric coatings 28 can also be positioned between vias 20 and semiconductor material layer 12 to electrically insulate vias from the semiconductor material layer as well. Dielectric coatings 28 can be configured to be thin enough to electrically insulate vias 20 from thermally conductive layer 38 without negatively impacting any thermal conduction between vias 20 and thermally conductive layer 38.

A barrier or buffer layer 36 can be positioned between Semiconductor material layer 12 and thermally conductive layer 38 to facilitate attachment of thermally conductive layer 38 to Semiconductor material layer 12 and/or to prevent contamination of semiconductor material layer 12 with particles from thermally conductive layer 38. Acceptable materials for barrier layer 36 can include SiC, SiN, diamond-like carbon ("DLC"), diamond, or other diamond moieties. Additionally, thermally conductive layer 38 may be coated with diamond or DLC or other diamond moieties. A diamond or DLC barrier layer 36 or coating can provides high levels of thermal conductivity while being an acceptable electrical insulator between semiconductor material layer 12 and thermally conductive layer 38. This assists in conducting heat from the semiconductor material layer 12 to the thermally conductive layer 38 or from the thermally conductive layer 38 to the environment (in instances of a coating). Further a coating of diamond or DLC applied over or around thermally conductive layer 38 can protect the thermally conductive layer from the surrounding environment.

Figure 2:
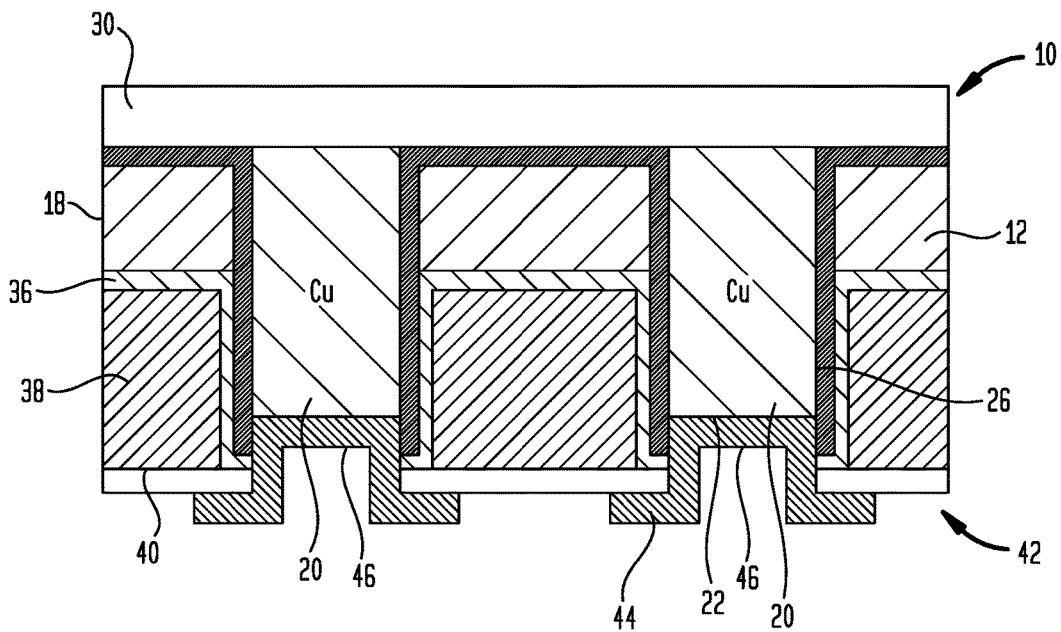
FIG. 2 is another example of an interconnect element according to another aspect of the disclosure.

As further shown in FIG. 1, interposer can include a redistribution layer 30 over surface 16 of semiconductor material layer 12. The redistribution layer can include, for example, traces 32 or additional vias connected to end surfaces 24 or vias 20 within a dielectric and can include contacts 34 exposed on redistribution layer 30 that can be, for example in a different spatial configuration than the end surfaces 24 with which they are connected. As further shown in FIG. 2, another redistribution layer 42 can be included over surface 40 of thermally conductive layer 38 that can include traces 44 and contacts 46 in a similar arrangement to that of redistribution layer 30. In some examples, spacers 54 can be of a thermally conductive compliant material, such as a dielectric with thermally conductive particles therein.

Figure 3A:
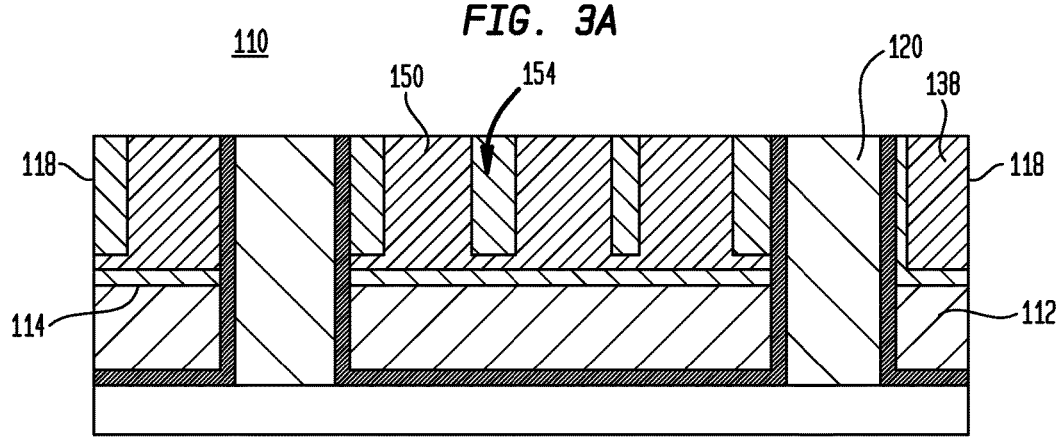
FIG. 3A is another example of an interconnect element according to another aspect of the disclosure.
Figure 3B:
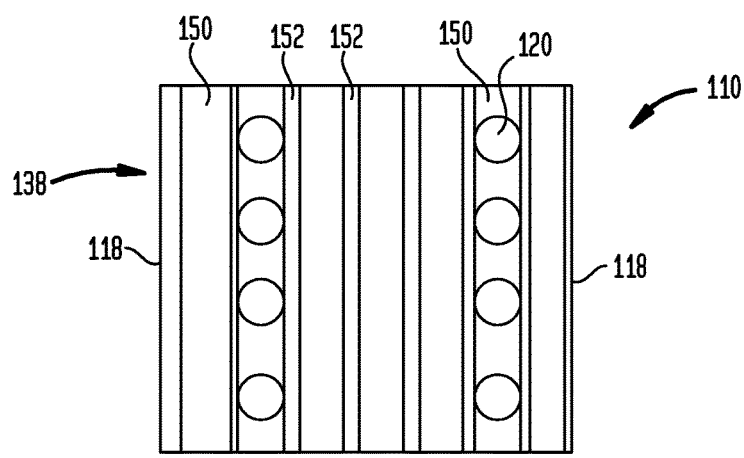
FIG. 3B is a top schematic view of an interconnect element of a similar construction to that shown in FIG. 3A.
Figure 3C:
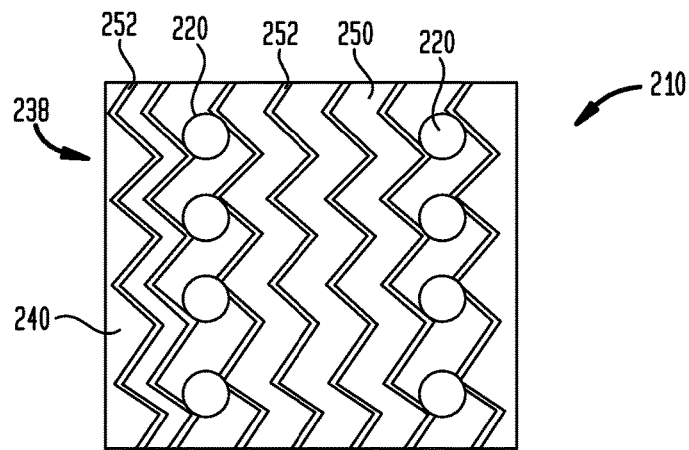
FIG. 3C is a top schematic view an interconnect element similar construction to that shown in FIG. 3A of an alternative configuration.
Figure 4:
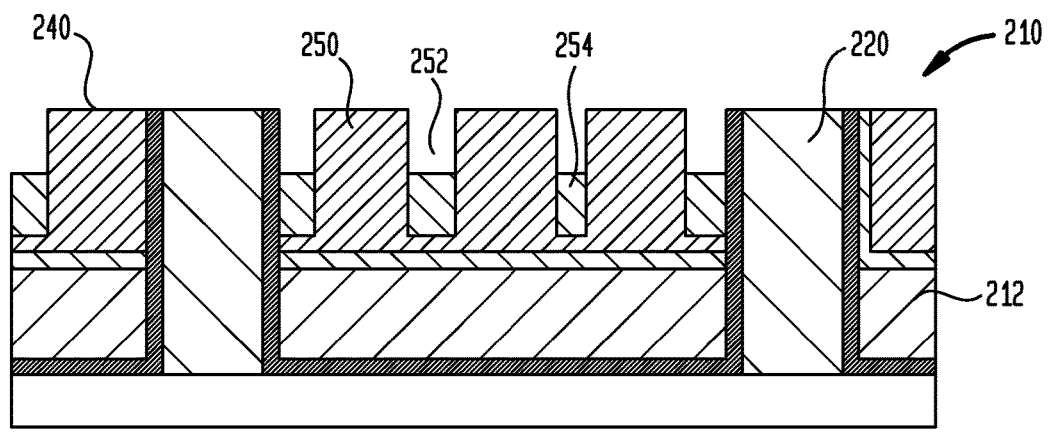
FIG. 4 is another example of an interconnect element according to another aspect of the disclosure.
Figure 5:
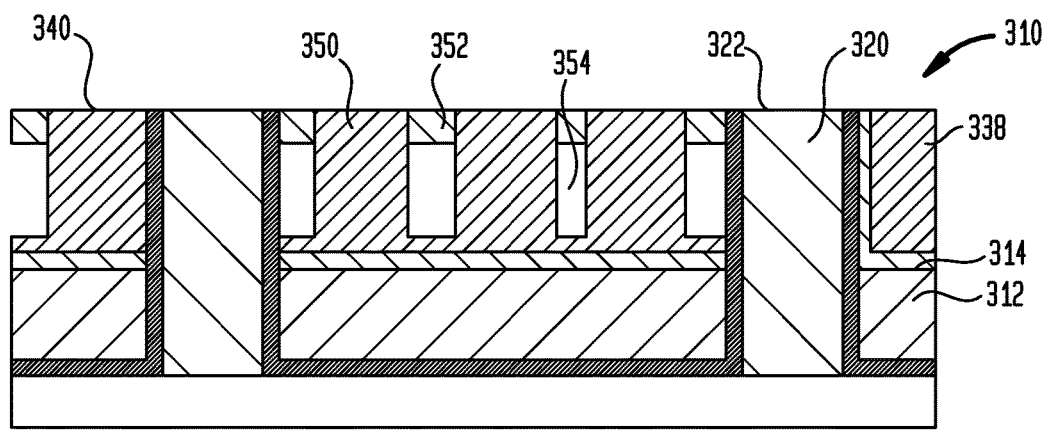
FIG. 5 is another example of an interconnect element according to another aspect of the disclosure.
Figure 6:
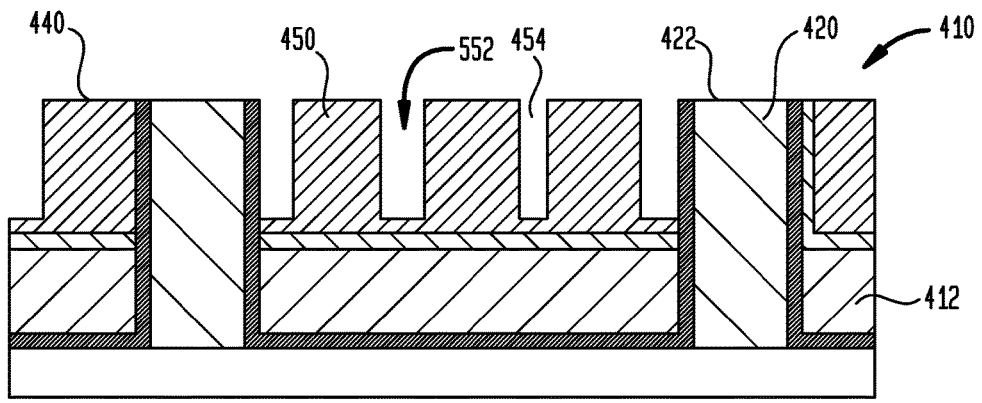
FIG. 6 is an interconnection element that is a variation of the interconnection element of FIGS. 4 and 5.

Another example of an interposer 110 according to an aspect of the present disclosure is shown in FIGS. 3A and 3B. In this example, thermally conductive layer 138 includes a plurality of segments 150 separated by gaps 152. Such gaps 152 can extend entirely through thermally conductive layer 138 such that segments 150 are completely separated or can extend only partway through thermally conductive layer 138 such that segments 150 are connected by portions of thermally conductive layer 138 adjacent surface 114. In the example of FIG. 3A, gaps 152 are filled with a compliant material that forms a plurality of respective spacers 154 between segments 150. The compliant nature of spacers 154 can be such that variations in thermal expansion between semiconductor material layer 12 and thermally conductive layer 38 can be absorbed at least partially by spacers 154. In the plan view of interposer 110 shown in FIG. 3B it can be seen that segments 150 can be structured to extend continuously in at least one lateral direction between edges 118 of interposer or between positions adjacent edges 118 of interposer 110. Such an arrangement can prevent any insulating properties of spacers 154 from preventing thermal conduction in at least one lateral direction. As illustrated in FIG. 3C, thermally conductive layer 238 can include gaps 252 that are not straight lines, but rather have components in multiple lateral directions. In the example interposer 210 shown, gaps 252 can have a zig-zag or sawtooth shape to provide for at least partial compliance in multiple lateral directions, while still having thermally conductive segments 250 that are continuous in a lateral direction. Also, while FIGS. 3B and 3C show variations with sections 150 and 250 extending in one direction, similar sections could extend in two directions, such as in a grid-like configuration. Also, the thermally conductive material sections could be laid out in one or more rings that are concentric with the conductive elements (such as 120 and 220). The thermally conductive sections, whether laid out as straight or zig-zag fins, as a grid or as concentric rings could be continuous or could have slits to allow for the different CTE of the thermally conductive sections and the semiconductor material layer.

Figure 7:
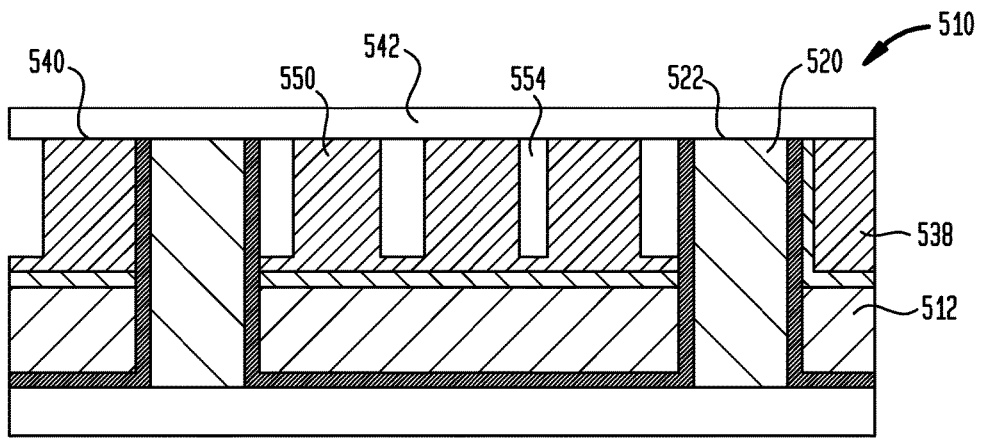
FIG. 7 shows the interconnection element of FIG. 6 with an additional redistribution layer thereon.

FIGS. 4-7 show further variations of interposers having segmented thermally conductive layers. In one example, interposer 310 can include gaps 352 separating segments 350 of thermally conductive layer 338. Such gaps 352 can include spacers 354 that extend from adjacent surface 314 of semiconductor material 312 to a location between surface 314 and the outside surface 340 of thermally conductive layer 338. In another example shown in FIG. 5, spacers 354 can be flush with surface 314 and can extend to a position spaced apart from surface 314 such. In a further example interposer 410 shown in FIG. 6, gaps 552 can be left unfilled. As shown in FIG. 7 an example of an interposer 510 having a segmented thermally conductive layer 538 can include a redistribution layer 542 over surface 540. In a similar manner, the interposers shown in FIGS. 3-5 can also include such a redistribution layer.

Figure 8:
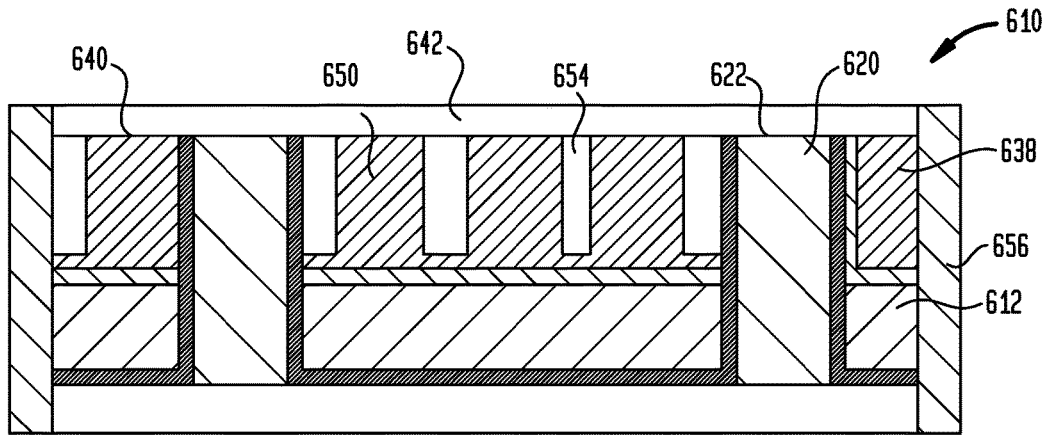
FIG. 8 shows the interconnection element of FIG. 7 with a thermally conductive frame element assembled therewith.

FIG. 8 shows a variation of an interposer 610 that includes a thermally conductive frame 656 that surrounds outside surfaces of both semiconductor material and thermally conductive layer 638. Thermally conductive frame can be of a similar or different material from thermally conductive layer 638, including any of the materials described above, and can be in contact with thermally conductive layer 638. Thermally conductive frame 656 can provide a heat sink for thermally conductive layer 638 to encourage further lateral heat dissipation therethrough and can provide for additional surface area of an exposed thermally conductive material to allow for additional exposure to ambient air for heat removal therefrom.

Figure 9:
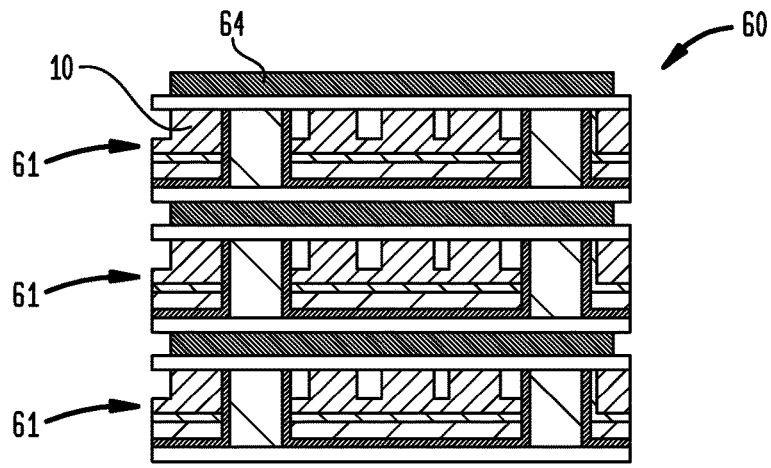
FIG. 9 shows an assembly of interconnection elements having microelectronic elements connected therewith and arranged in a stacked configuration.
Figure 10:
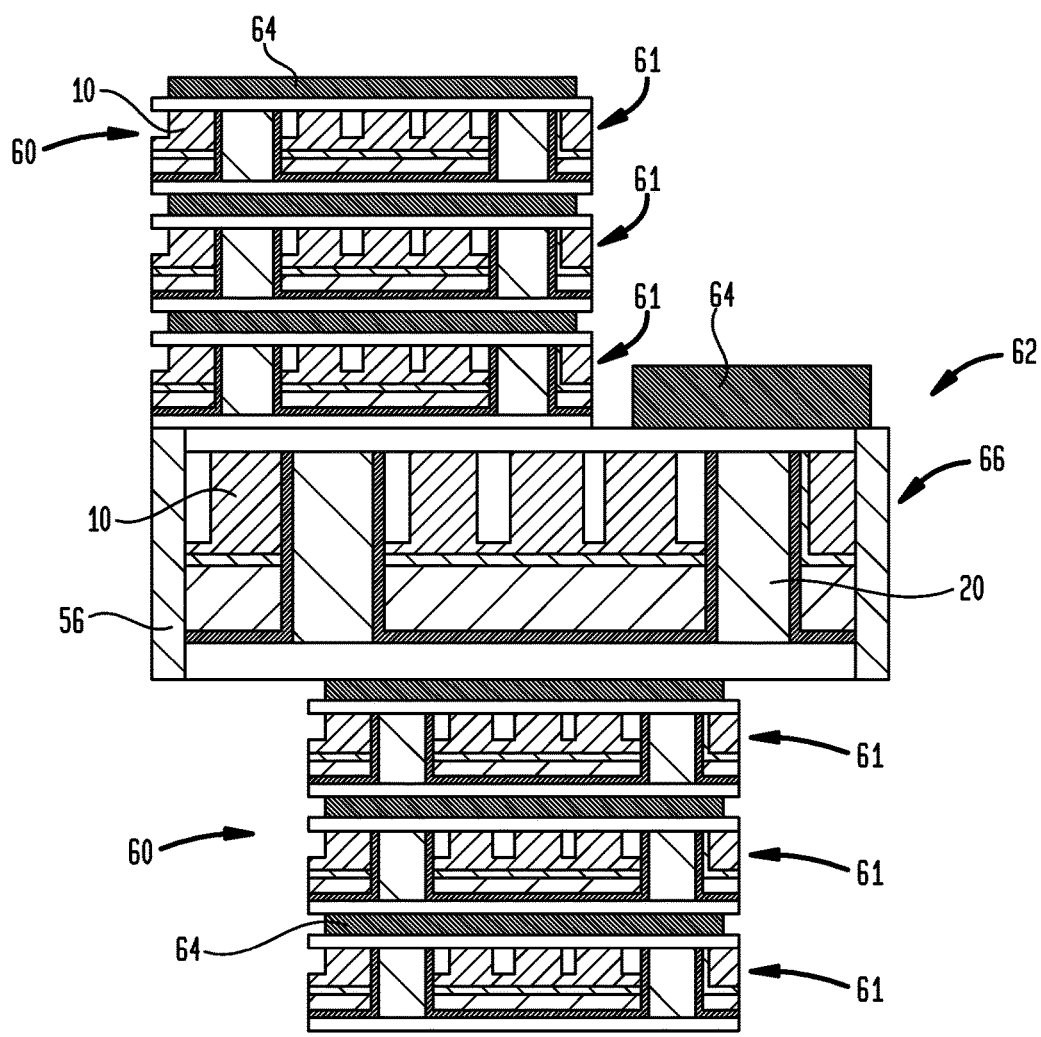
FIG. 10 shows the a further assembly of sub-assemblies show in FIG. 9 with additional elements.

FIGS. 9 and 10 show examples of different types of microelectronic assemblies that can incorporate interposers 10 of any of the types described in the preceding examples. For clarity, the interposers 10 shown in FIGS. 9 and 10 are similar to those described above with respect to FIG. 1. The assembly 60 shown in FIG. 9 includes a stack of subassemblies 61 that can include a microelectronic element 64 carried on an interposer such that contacts (not shown) on the microelectronic element are connected with contacts 64 of the interposer 10. The subassemblies can then be stacked on top of one another and electrically connected together, either through designated ones of vias 20 that are connected together through routing circuitry of the redistribution layers 30 and 42, for example. Such an assembly can, in one example, be a stack of DRAM chips.

FIG. 10 shows a further assembly 62 that can include a stacked assembly 60 or multiple stacked assemblies 60, as shown, such as that described with respect to FIG. 9, assembled on a relatively larger interposer 66 that is shown as being similar to the interposer 610 described above with respect to FIG. 8, but can also be similar to any of those described above with respect to FIGS. 1-7 or can be another type of interposer. Another microelectronic element 64 can be connected with interposer 66 and can be, in one example, a central processing unit ("CPU") and/or a graphics processing unit ("GPU") such that assembly 62 can be configured as a "system on a chip" type of processor that can be used, in some examples, in portable electronic devices and the like.

Figure 11:
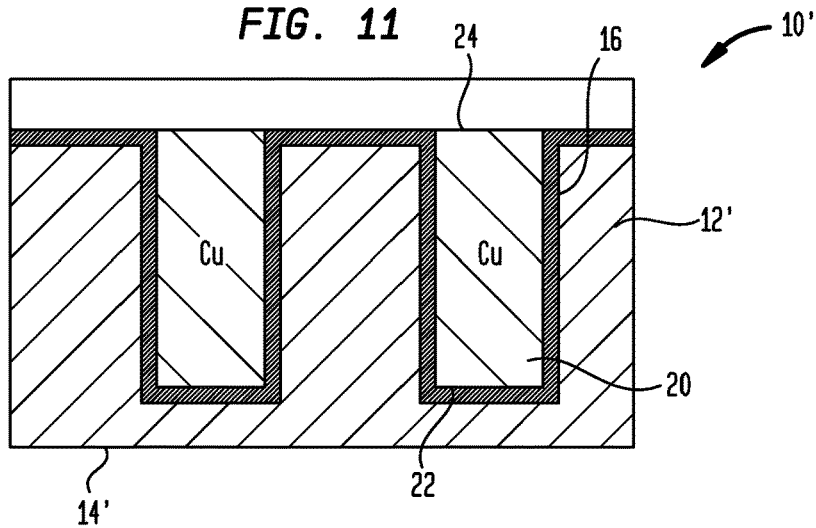
FIGS. 11-17 show an interconnection element during various sequential stages of formation thereof in a method according to another aspect of the disclosure.

FIGS. 11-24 show an in-process unit 10' during various steps of a method that can be used to make an interposer 10 according to the examples described above. FIG. 11 shows in-process unit 10' as a bulk semiconductor layer 12' having blind vias 20 with end surfaces 24 at surface 16 of the bulk semiconductor layer 12' and surface 14' of bulk semiconductor layer 12' spaced above end surfaces 22 of vias 20, although in other variations vias 20 can be formed as through vias with both ends 22 and 24 at respective surfaces 14 and 16 of bulk semiconductor layer 12'. Bulk semiconductor layer 12' can include a redistribution layer 30 over surface 16, as discussed above with respect FIG. 1.

Figure 12:
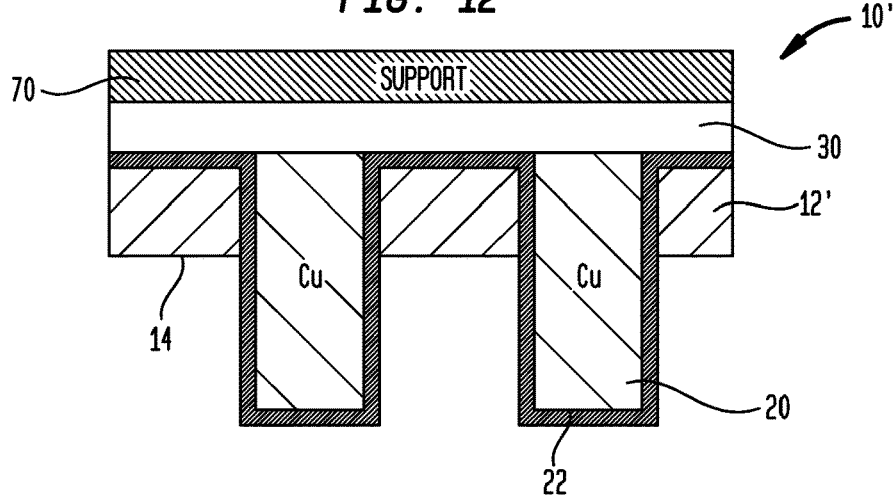
Figure 13:
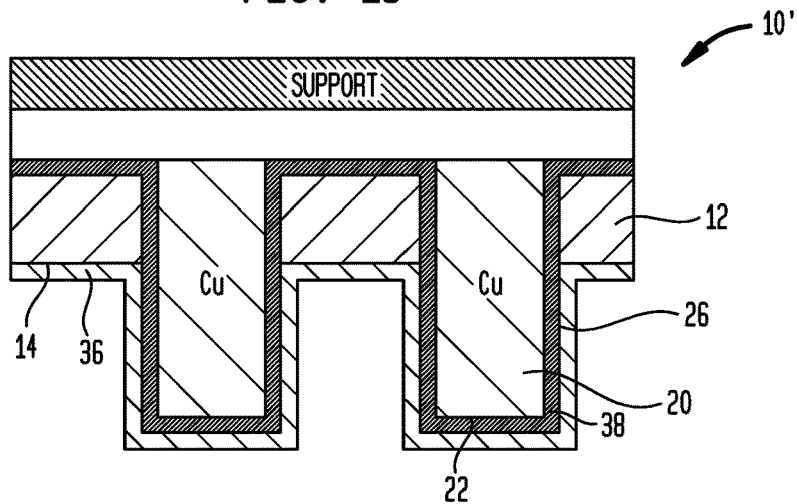
Figure 14:
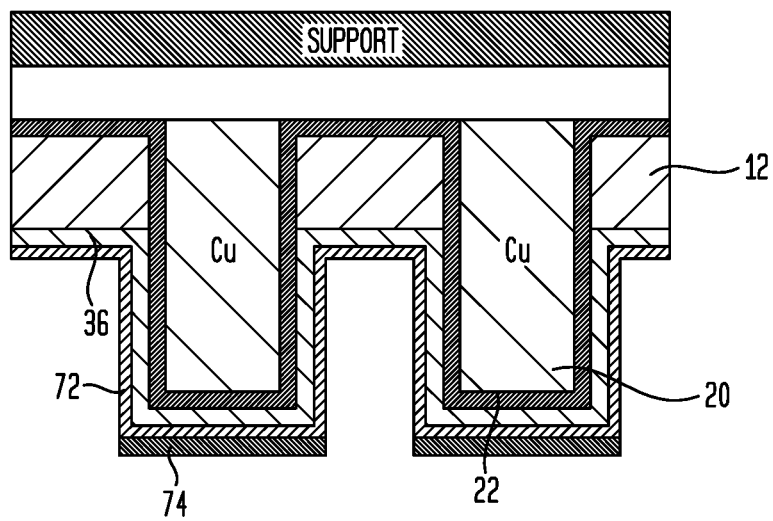
Figure 15:
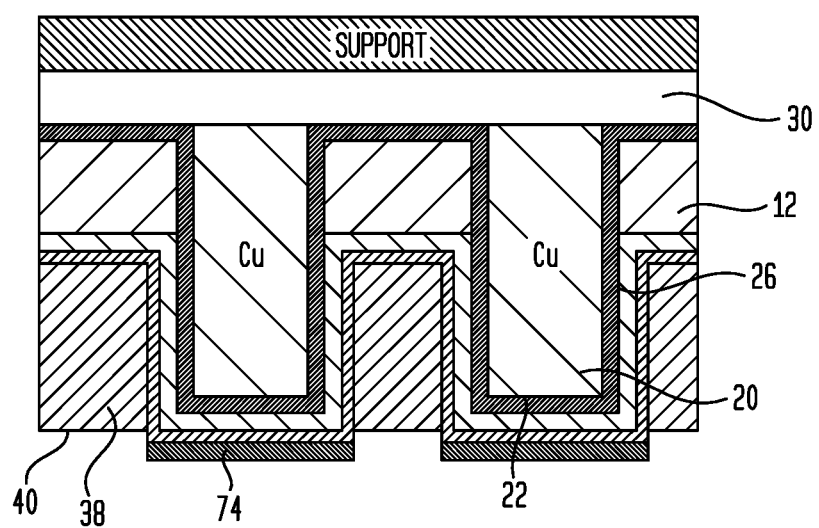

As shown in FIG. 12, bulk semiconductor layer 12' can then be reduced in thickness to form the semiconductor material layer 12, as described above with respect to FIG. 1 this reduction can be accomplished by removing material from bulk semiconductor layer 12' between vias 20, which can be done by chemical or mechanical processes such as chemical etching, laser etching or the like. In-process unit 10' (FIG. 11) can be temporarily affixed with a support substrate 70 to provide additional strength for the temporarily-thinned in-process unit 10'. (FIG. 12.) Barrier layer 36 can then be deposited over surface 14, as formed in the reduction step of FIG. 12. As shown in FIG. 13, barrier layer 36 can further be deposited over vias 20, including over dielectric coatings 28 that can overlie edge surfaces 26 and end surfaces 22 of vias 20. Barrier layer 36 can be formed by electroplating, electroless plating, chemical vapor deposition ("CVD") or the like. A seed layer 72 can then be added over barrier layer 36 that can be of the same material that is intended to be used for thermally conductive layer, such as copper or the like. Seed layer 72 can be added to in-process unit 12' by electroplating, electroless plating, CVD or the like. Further, portions of a resist layer 74 can be deposited over barrier layer 36 and seed layer 72 to overlie end surfaces 22 of vias 20.

Thermally conductive layer 38 can then be deposited over seed layer 72 such as by plating, electroless plating, spin coating, or the like. Thermally conductive layer can be any of the types of materials discussed above with respect to FIG. 1. Thermally conductive layer 38 can be deposited to a thickness such that an outside surface 40 is even with end surfaces 22 or with outside surface 40 spaced above end surfaces 22. In such a configuration, resist layer portions 74 can prevent build up of thermally conductive material over end surfaces 22. In either such configuration, thermally conductive layer 38 can then be chemically or mechanically polished such that surface 40 can be even with or substantially even with end surfaces 22 of vias 20 and/or to remove resist layer portions 74.

Figure 16:
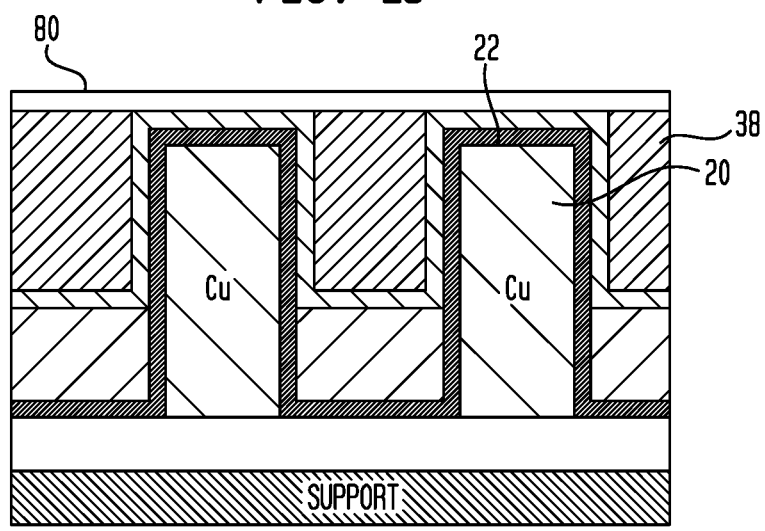
Figure 17:
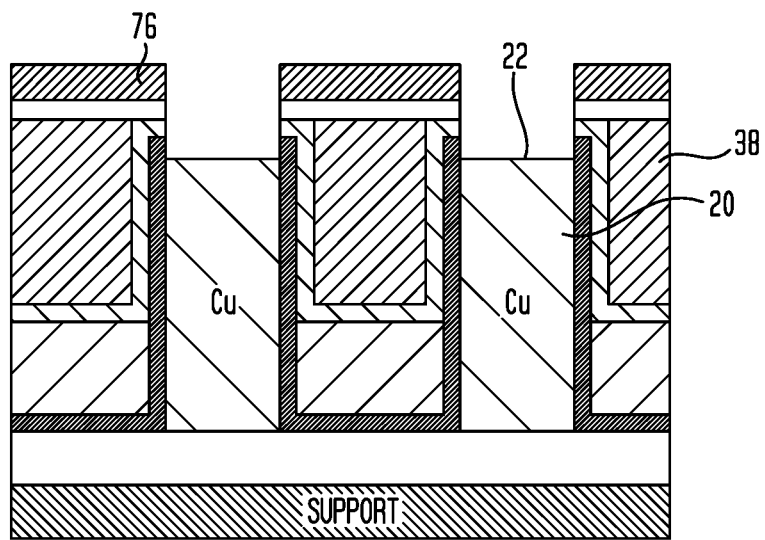

In examples where a redistribution layer 42 is to be formed over surface 40, a dielectric layer portion 80 can be deposited over surface 40, followed by a mask layer 76 that can be of, for example, a resist material, as shown in FIGS. 16 and 17. The mask layer 76 can be patterned to remove portions thereof overlying vias 20 so that any portions of thermally conductive layer 38, barrier layer 36, or portions of dielectric coating 28 overlying end surfaces 22 can be removed by etching or the like. This can allow for traces 44 of redistribution layer 42 to be connected therewith, as described above with respect to FIG. 2.

Figure 18:
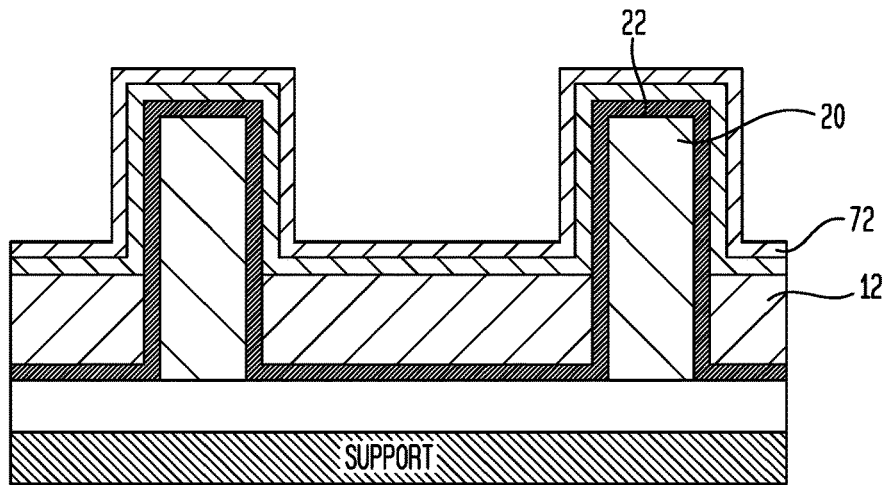
FIGS. 18-22 show an interconnection element during various sequential stages of formation thereof in an alternative method according to another aspect of the disclosure.
Figure 19:
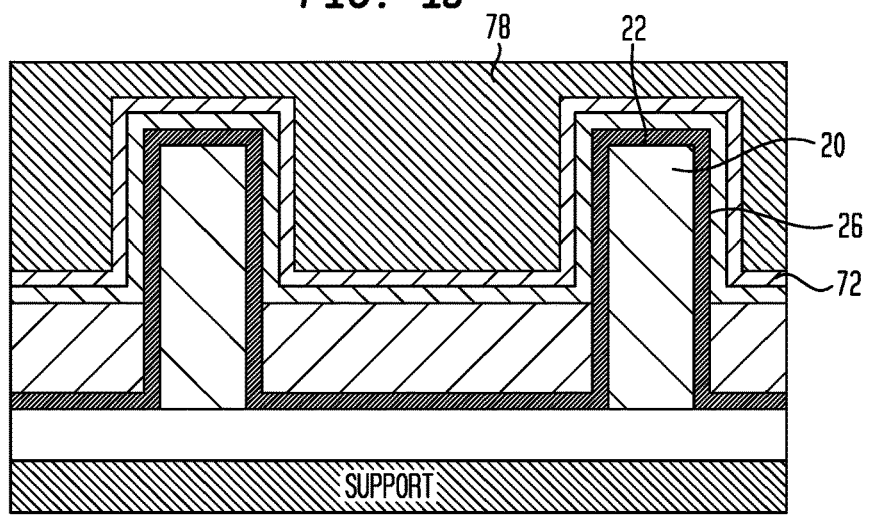
Figure 20:
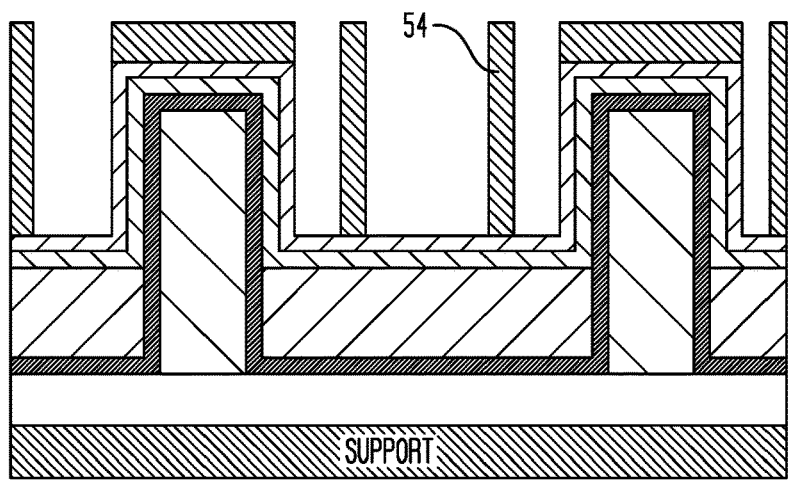
Figure 21:
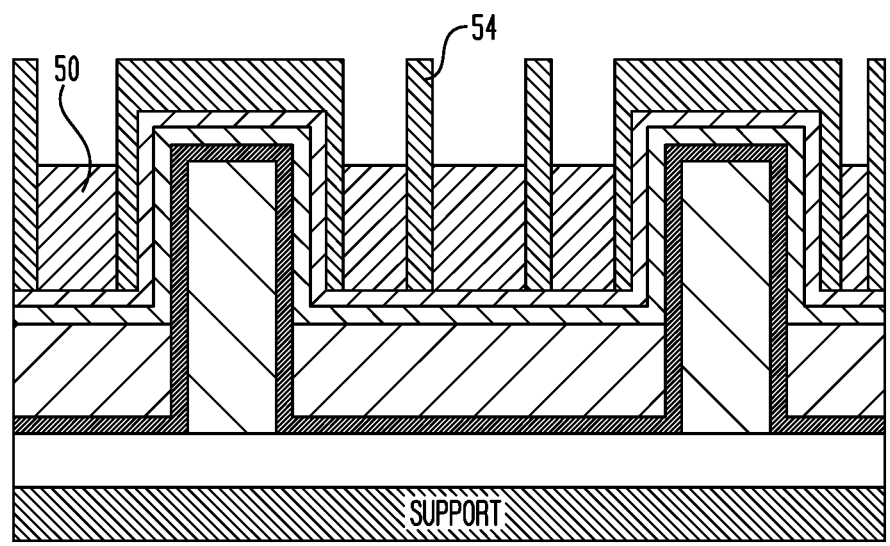
Figure 22:
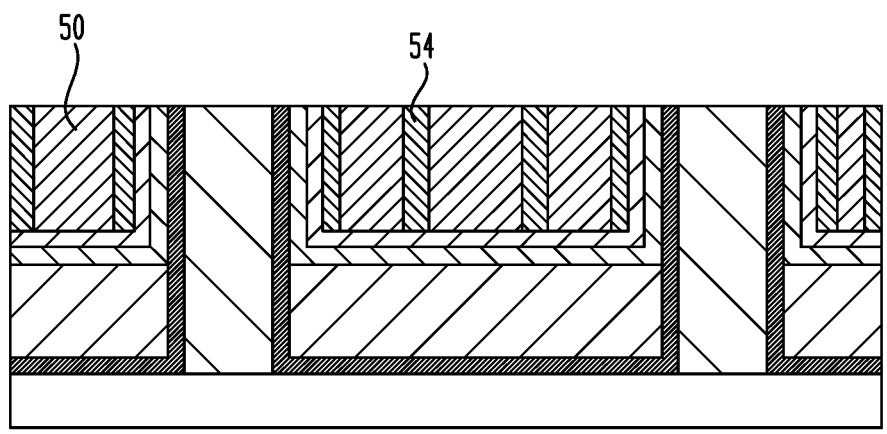

Various method steps can be performed on in-process unit 12' to make an interposer with a segmented thermally conductive layer such as that shown in FIGS. 3-8. In one method, as shown in FIGS. 18-22, a patternable layer 78 can be deposited over seed layer 72, as shown in FIG. 18. The patternable layer 78 can be deposited to a thickness adequate to fully cover vias 20 or other suitable heights. The patternable layer can be of a resist material or the like and can further be a compliant dielectric material that is also suitable as a resist layer. The patternable layer 78 can then be patterned, such as by mechanical etching including laser etching or the like to make spacers 54, as shown in FIG. 20. The spacers 54 can be of any configuration described above with respect to FIGS. 3-8. Subsequently, thermally conductive material can be deposited on in-process unit 10' by any of the processes described above. Thermally conductive material can be deposited over Semiconductor material layer 12 between the spacers 54 formed previously such that thermally conductive material is in segments 50, as described above and as shown in FIG. 21. Portions of the spacers 54 that extend outside of thermally conductive material layer 38 or above segments 50 thereof can then be removed such that spacers 54 are generally flush with surface 40, as shown in FIG. 22.

Figure 23:
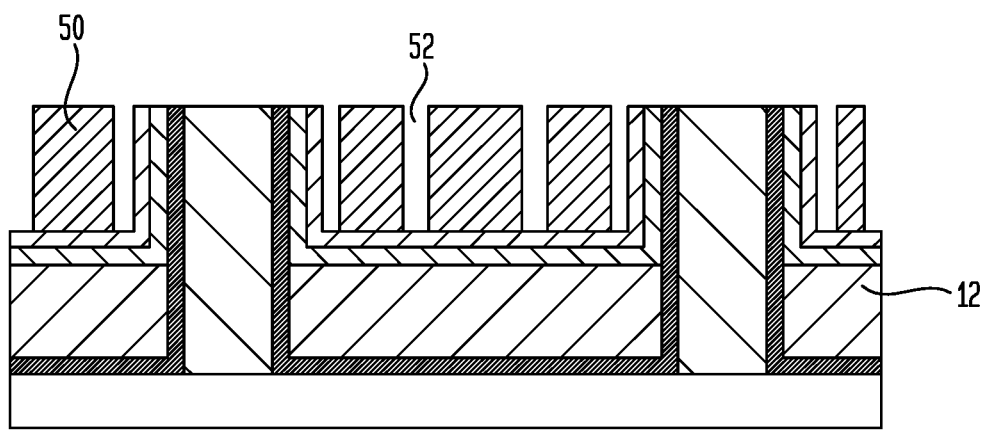
FIGS. 23 and 24 show the interconnection element of FIGS. 18-22 during additional optional method steps.
Figure 24:
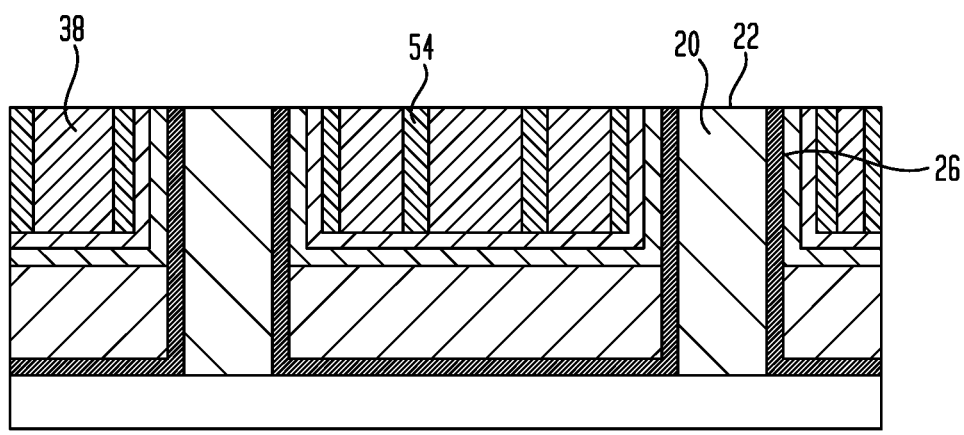

In another sequence of steps, thermally conductive layer 38 can be deposited over Semiconductor material layer 12, as described above with respect to FIG. 15. Before or after additional processing steps also described above, thermally conductive layer can be segmented by chemical or mechanical processes, such as etching, laser etching, sawing, or the like, to form gaps 52 in any of the above-described patterns, shapes, or forms, as shown in FIG. 23. Gaps 52 can be left open, as shown in FIG. 7 for interposer 10 is assembled with other components, as described above, or otherwise finished, such as by formation of a redistribution layer 42. Alternatively, gaps 52 can be filled with a dielectric material, or a compliant dielectric material, as described above to make spacers 54 therein, as shown in FIG. 24. The dielectric material can be deposited within gaps 52 by molding a curable liquid material layer or by depositing a curable liquid material over thermally conductive layer 38 and then by wiping or otherwise forcing such a liquid material into gaps 52. Such processes can be carried out to achieve any of the spacer 54 configurations shown in FIGS. 3-5.

The interposer 10 resulting from any of the above particular formation methods can then be assembled with other components, such as microelectronic elements or the like, or together with other interposers or the like, to make assemblies such as assembly 60 shown in FIG. 9 or assembly 62 shown in FIG. 10.

Although the description herein has been made with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. An assembly comprising:
    an interconnect component comprising:
        a thermally conductive carbon layer;
        an insulating layer overlying the thermally conductive carbon layer;
        a plurality of conductive vias extending through the conductive layer and the insulating layer, such that a first end of the plurality of conductive vias is disposed at an outermost surface of the insulating layer and an opposed second end of the plurality of conductive vias is disposed at an outermost surface of the thermally conductive carbon layer; and a dielectric layer extending along a length of the plurality of conductive vias, such that the thermally conductive carbon layer and the insulating layer are spaced away from the plurality of conductive vias by the dielectric layer.

2. The interconnect component according to claim 1, wherein portions of the thermally conductive carbon layer include thermally conductive carbon segments separated by gaps within the thermally conductive carbon layer.

3. The interconnect component of claim 2, wherein the gaps extend entirely through the thermally conductive carbon layers such that the thermally conductive carbon segments are completely separated from one another.

4. The interconnect component of claim 2, wherein the gaps extend partially through the thermally conductive layer, such that at least portions of the thermally conductive carbon segments are connected together.

5. The interconnect component of claim 2, wherein the gaps are filled with a compliant material forming a plurality of respective spacers between the thermally conductive carbon segments so as to absorb variations in thermal expansion between the insulating layer and the thermally conductive layer.

6. The interconnect component of claim 2, wherein the plurality of spacers extend in a planar direction.

7. The interconnect component of claim 2, wherein the plurality of spacers extend in multiple lateral directions.

8. The interconnect component of claim 2, wherein the insulating layer is a dielectric layer.

9. The interconnect component according to claim 1, further comprising a redistribution layer overlying the interconnect component and electrically connected with the plurality of conductive vias.

* * * * *